(12) United States Patent
Yun

(10) Patent No.: US 12,158,504 B2
(45) Date of Patent: Dec. 3, 2024

(54) APPARATUS AND METHOD FOR ESTIMATING SOC

(71) Applicant: LG CHEM, LTD., Seoul (KR)

(72) Inventor: Seong-Jun Yun, Daejeon (KR)

(73) Assignee: LG ENERGY SOLUTION, LTD., Seoul (KR)

(*) Notice: Subject to any disclaimer, the term of this patent is extended or adjusted under 35 U.S.C. 154(b) by 649 days.

(21) Appl. No.: 16/964,132

(22) PCT Filed: Sep. 26, 2019

(86) PCT No.: PCT/KR2019/012543
§ 371 (c)(1),
(2) Date: Jul. 22, 2020

(87) PCT Pub. No.: WO2020/067741
PCT Pub. Date: Apr. 2, 2020

(65) Prior Publication Data
US 2021/0033678 A1    Feb. 4, 2021

(30) Foreign Application Priority Data

Sep. 27, 2018  (KR) .................. 10-2018-0114990

(51) Int. Cl.
*G01R 31/3842*  (2019.01)
*B60L 58/12*  (2019.01)
(Continued)

(52) U.S. Cl.
CPC .......... *G01R 31/3842* (2019.01); *B60L 58/12* (2019.02); *G01R 31/367* (2019.01);
(Continued)

(58) Field of Classification Search
None
See application file for complete search history.

(56) References Cited

U.S. PATENT DOCUMENTS

2002/0021108 A1* 2/2002 Suzuki .................. H02J 7/0048
320/132
2004/0032264 A1    2/2004 Schoch
(Continued)

FOREIGN PATENT DOCUMENTS

CN    101966820 A    2/2011
CN    102381210 A    3/2012
(Continued)

OTHER PUBLICATIONS

Office Action dated Dec. 29, 2021 issued in corresponding Korean Patent Application No. 10-2018-0114990.
(Continued)

*Primary Examiner* — Brent A. Fairbanks
(74) *Attorney, Agent, or Firm* — Morgan, Lewis & Bockius LLP

(57) ABSTRACT

The present disclosure relates to a state of charge (SOC) estimating apparatus and method, and more particularly, to a SOC estimating apparatus and method for estimating an initial SOC when a starting light ignition (SLI) battery starts a vehicle. According to an aspect of the present disclosure, there is an advantage of accurately estimating the initial SOC of a vehicle-starting battery that always uses a current regardless of a driving mode or a parking mode of the vehicle.

20 Claims, 2 Drawing Sheets

(51) Int. Cl.
*G01R 31/367* (2019.01)
*G01R 31/374* (2019.01)
*G01R 31/389* (2019.01)

(52) U.S. Cl.
CPC ......... *G01R 31/374* (2019.01); *G01R 31/389* (2019.01); *B60L 2240/547* (2013.01); *B60L 2240/549* (2013.01)

(56) References Cited

U.S. PATENT DOCUMENTS

| | | | |
|---|---|---|---|
| 2008/0052555 A1* | 2/2008 | Kobayashi | G06F 1/3203 |
| | | | 713/600 |
| 2008/0150457 A1 | 6/2008 | Salman et al. | |
| 2008/0180062 A1 | 7/2008 | Okumura | |
| 2010/0085009 A1 | 4/2010 | Kang et al. | |
| 2011/0184677 A1 | 7/2011 | Tae et al. | |
| 2012/0166841 A1* | 6/2012 | Holsen | G01R 31/396 |
| | | | 713/340 |
| 2013/0300425 A1* | 11/2013 | Shiraishi | G01R 31/382 |
| | | | 324/426 |
| 2014/0316628 A1 | 10/2014 | Miyashita et al. | |
| 2015/0112527 A1 | 4/2015 | Zhang et al. | |
| 2015/0314700 A1 | 11/2015 | Ahn et al. | |
| 2016/0131716 A1* | 5/2016 | Takashima | G01R 31/3842 |
| | | | 702/63 |
| 2017/0254856 A1* | 9/2017 | Shiraishi | B60R 16/03 |
| 2018/0001782 A1 | 1/2018 | Zhao et al. | |
| 2018/0259585 A1* | 9/2018 | Shiraishi | B60L 58/14 |

FOREIGN PATENT DOCUMENTS

| | | |
|---|---|---|
| CN | 104977544 A | 10/2015 |
| CN | 108569231 A | 9/2018 |
| EP | 3 373 021 A1 | 9/2018 |
| JP | 2004-022322 A | 1/2004 |
| JP | 2004-325263 A | 11/2004 |
| JP | 2007-174865 A1 | 7/2007 |
| JP | 2007-269051 A | 10/2007 |
| JP | 4997994 B2 | 8/2012 |
| JP | 2014-036529 A | 2/2014 |
| JP | 5729484 B2 | 6/2015 |
| JP | 2017-223536 A | 12/2017 |
| JP | 2018-125977 A | 8/2018 |
| JP | 2018-146416 A | 9/2018 |
| KR | 10-2011-0087569 A | 8/2011 |
| KR | 10-2013-0015499 A | 2/2013 |
| KR | 10-1238478 B1 | 3/2013 |
| KR | 10-1402802 B1 | 6/2014 |
| KR | 10-2015-0126208 A | 11/2015 |
| KR | 10-1841044 B1 | 3/2018 |
| KR | 10-2018-0064106 A | 6/2018 |
| WO | 2009/118904 A1 | 10/2009 |
| WO | 2015/008620 A | 1/2015 |
| WO | 2015/011801 A1 | 1/2015 |

OTHER PUBLICATIONS

International Search Report issued in corresponding International Patent Application No. PCT/KR2019/012543, dated Jan. 20, 2020.
Extended European Search Report dated May 6, 2021, issued in corresponding European Patent Application No. 19865502.9.

* cited by examiner

APPARATUS AND METHOD FOR ESTIMATING SOC

TECHNICAL FIELD

The present application claims priority to Korean Patent Application No. 10-2018-0114990 filed on Sep. 27, 2018 in the Republic of Korea, the disclosures of which are incorporated herein by reference.

The present disclosure relates to a SOC estimating apparatus and method, and more particularly, to a SOC estimating apparatus and method for estimating an initial SOC when a SLI (Starting Lighting Ignition) battery starts a vehicle.

BACKGROUND ART

In recent years, the demand for portable electronic products such as notebook computers, video cameras and portable phones has increased sharply, and the energy storage batteries, robots and satellites has been active developed. Accordingly, high-performance secondary batteries allowing repeated charging and discharging are being actively studied.

Secondary batteries commercially available at present include nickel-cadmium batteries, nickel-hydrogen batteries, nickel-zinc batteries, lithium secondary batteries and the like. Among them, the lithium secondary batteries have almost no memory effect compared to nickel-based secondary batteries and thus are in the limelight due to advantageous of free charging and discharging, low self-discharge rate and high energy density.

In particular, in recent years, as carbon energy is gradually exhausted and interest in the environment is increasing, the demand for hybrid electric vehicles and electric vehicles is increasing gradually in the United States, Europe, Japan, and Korea. Since a hybrid electric vehicle or an electric vehicle obtains a vehicle driving power by using the charge/discharge energy of a battery pack, it gives a favorable impression to many consumers in that it is more fuel efficient than a vehicle using only an engine and may emit no or less pollutant. Thus, more attention and research are focused on the battery for a vehicle, which is a key component of a hybrid electric vehicle or an electric vehicle.

As described above, the battery is used in various mobile devices such as vehicles. Since the battery has a limited use time, it is important to know accurate information about a state of charge (SOC) of the battery. Since the SOC is a measure to figure out how much time the battery may be used, this is very important information for the user in using the device. Thus, general battery-equipped devices such as laptops, mobile phones, vehicles, and the like estimate the SOC of the battery and provide the user with information such as the available time or the available amount of the battery from the SOC.

In general, in the case of a SLI battery used for starting a vehicle, the SLI battery may be continuously discharged by electronic equipment (for example, a black box) while the vehicle is parked. Due to this phenomenon, the initial SOC when the SLI battery starts the vehicle may be greatly different from the SOC at the end of the starting of the vehicle.

In addition, when the vehicle is parked to terminate the starting of the vehicle, a battery management system (BMS) may be switched to a sleep mode for efficient power operation. In the sleep mode, the BMS is not able to measure a discharge current value of the vehicle-starting battery, and as a result, it is difficult to estimate the initial SOC of the battery when starting the vehicle.

DISCLOSURE

Technical Problem

The present disclosure is designed to solve the problems of the related art, and therefore the present disclosure is directed to providing an improved SOC estimating apparatus and method for estimating an initial SOC when a SLI (Starting Lighting Ignition) battery provided to a vehicle starts the vehicle.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a SOC estimating apparatus for estimating a SOC of a vehicle-starting battery, comprising: a current measuring unit configured to measure a discharge current of the battery; a voltage measuring unit configured to measure both-end voltage of the battery; and a processor configured to receive the discharge current value and the both-end voltage value of the battery from the current measuring unit and the voltage measuring unit, measure a parking duration of the vehicle, determine a SOC estimation mode based on the parking duration, and estimate an initial SOC of the battery at the starting of the vehicle based on the discharge current value during the parking duration according to the determined SOC estimation mode, or correct the both-end voltage value of the battery based on the discharge current value when measuring the both-end voltage of the battery and estimate the initial SOC of the battery at the starting of the vehicle based on the corrected both-end voltage value of the battery.

In addition, the processor may be configured to measure the parking duration based on an elapse time from a start ending point of the vehicle to a restarting point of the vehicle.

In addition, when the vehicle is parked to terminate the starting of the vehicle, the processor may be configured to wake up at every predetermined cycle during the parking duration and estimate a SOC of the battery based on the discharge current value measured by the current measuring unit at the wake-up.

In addition, the processor may be configured to estimate a SOC change amount during one cycle based on the discharge current value measured by the current measuring unit at the wake-up and estimate a SOC of the battery based on the SOC change amount.

In addition, the processor may be configured to update the SOC of the battery at every wake-up cycle during the parking duration by correcting the SOC of the battery based on a value obtained by subtracting a SOC change amount estimated at a present cycle from the SOC of the battery estimated at a previous cycle.

In addition, the processor may determine the SOC estimation mode based on the parking duration and a predetermined reference time value, and the SOC estimation mode may include a SOC correction mode in which the initial SOC of the battery at the starting of the vehicle is estimated based on the discharge current value of the battery during the parking duration, and an OCV estimation mode in which the both-end voltage value of the battery is corrected based on the discharge current value of the battery and the initial SOC of the battery at the starting of the vehicle is estimated based on the corrected both-end voltage value of the battery.

In addition, the processor may be configured to determine that the SOC estimation mode is the SOC correction mode when the parking duration is smaller than the predetermined reference time value.

In addition, when it is determined that the SOC estimation mode is the SOC correction mode, the processor may be configured to estimate the initial SOC of the battery at the starting of the vehicle based on the SOC of the battery updated at every wake-up cycle.

In addition, the processor may be configured to estimate a SOC change amount after a previous wake-up cycle based on the discharge current value at the starting of the vehicle, correct the SOC of the battery updated at the previous wake-up cycle based on the SOC change amount, and estimate the initial SOC of the battery at the starting of the vehicle based on the corrected SOC of the battery.

In addition, the processor may be configured to determine that the SOC estimation mode is the OCV estimation mode when the parking duration is equal to or greater than the predetermined reference time value.

In addition, the SOC estimating apparatus according to an embodiment of the present disclosure may further comprise a temperature measuring unit configured to measure a temperature of the battery.

In addition, the processor may be configured to receive the temperature measurement value of the battery from the temperature measuring unit, and, when it is determined that the SOC estimation mode is the OCV estimation mode, the processor may be configured to estimate an OCV of the battery based on the both-end voltage value, the discharge current value and the temperature measurement value measured at the starting of the vehicle and estimate the initial SOC of the battery at the starting of the vehicle based on the estimated OCV using a SOC-OCV lookup table.

In addition, the processor may be configured to calculate an internal resistance value of the battery based on the SOC of the battery updated at a previous wake-up cycle and the temperature measurement value, and estimate the OCV of the battery based on a difference between the product of the calculated internal resistance value and the discharge current value and the both-end voltage value.

In addition, a BMS according to an embodiment of the present disclosure may comprise the SOC estimating apparatus according to the present disclosure.

In addition, a battery pack according to an embodiment of the present disclosure may comprise the SOC estimating apparatus according to the present disclosure.

In addition, a SOC estimating method according to an embodiment of the present disclosure for estimating a SOC of a vehicle-starting battery comprises: a current measuring step of measuring a charge/discharge current of the battery; a voltage measuring step of measuring both-end voltage of the battery; and a SOC estimating step of receiving the discharge current value and the both-end voltage value of the battery measured in the current measuring step and the voltage measuring step, measuring a parking duration of the vehicle, determining a SOC estimation mode based on the parking duration, and estimating an initial SOC of the battery at the starting of the vehicle based on the discharge current value during the parking duration according to the determined SOC estimation mode, or correcting the both-end voltage value of the battery based on the discharge current value when measuring the both-end voltage of the battery and estimating the initial SOC of the battery at the starting of the vehicle based on the corrected both-end voltage value of the battery.

Advantageous Effects

According to an aspect of the present disclosure, there is an advantage of accurately estimating the initial SOC of a vehicle-starting battery that always uses a current regardless of a driving mode or a parking mode of the vehicle.

According to another aspect of the present disclosure, the SOC of the vehicle-starting battery may be continuously estimated at a predetermined cycle repeatedly during the parking duration of the vehicle.

According to another aspect of the present disclosure, both-end voltage of the battery measured at the starting of the vehicle is not directly used as the OCV of the battery, the OCV of the vehicle-starting battery may be accurately estimated in consideration that a current always flows at the vehicle-starting battery.

The present disclosure may have various effects other than the above, and other effects of the present disclosure may be understood from the following description and more clearly figured out by the embodiments of the present disclosure.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

In addition, in the present disclosure, if it is determined that a detailed description of a related known structure or function may obscure the subject matter of the present disclosure, the detailed description will be omitted.

Throughout the specification, when a portion is referred to as "comprising" or "including" any element, it means that the portion may include other elements further, without excluding other elements, unless specifically stated otherwise. Furthermore, the term "processor" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

In the specification, a secondary battery means one independent cell that has a cathode terminal and an anode terminal and is physically separable. For example, one pouch-type lithium polymer cell may be considered as a secondary battery. In addition, in this specification, the cell assembly may include at least one secondary battery connected in series and/or in parallel.

Figure 1:
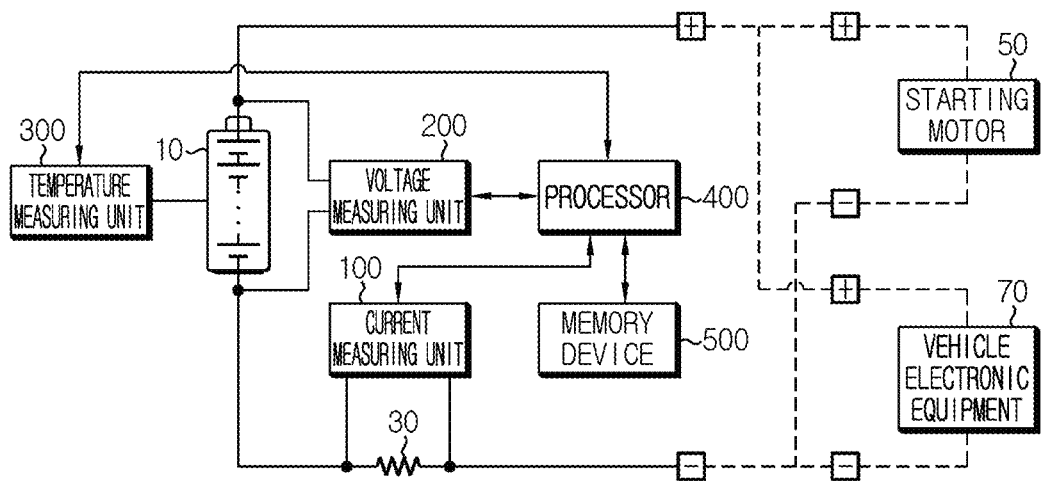
FIG. 1 is a diagram schematically showing that a SOC estimating apparatus according to an embodiment of the present disclosure is provided to a battery pack.

A SOC estimating apparatus according to an embodiment of the present disclosure may be an apparatus for estimating a SOC of a vehicle-starting battery provided to a vehicle. For example, the vehicle-starting battery may be a 12V SLI (Starting Lighting Ignition) battery. For example, as shown in FIG. 1, a battery equipped with the SOC estimating apparatus according to an embodiment of the present disclosure may be electrically connected to a starting motor 50. For example, when a processor 400 receives a vehicle start signal (e.g., an ignition signal), the battery may transfer power to the starting motor 50.

In addition, the battery equipped with the SOC estimating apparatus according to an embodiment of the present disclosure may be, as shown in FIG. 1, electrically connected to vehicle electronic equipment 70. For example, the vehicle electronic equipment 70 may be an electronic device provided to the vehicle such as a cooling device, a preheating device, a fuel supply device, a lighting device, a metering device, and the like. For example, the battery may supply power to the vehicle electronic equipment 70 regardless of whether the starting of the vehicle ends or not, in a driving mode in which the vehicle is driven and in a parking mode in which the vehicle is parked. That is, the SOC estimating apparatus according to an embodiment of the present disclosure may be an apparatus for estimating a SOC of the vehicle-starting battery that always uses a current regardless of the driving mode or the parking mode of the vehicle.

FIG. 1 is a diagram schematically showing that a SOC estimating apparatus according to an embodiment of the present disclosure is provided to a battery pack.

Referring to FIG. 1, the SOC estimating apparatus according to an embodiment of the present disclosure may include a current measuring unit 100, a voltage measuring unit 200, and a processor 400.

The current measuring unit 100 may be electrically connected to a current sensor 30 provided on a charging/discharging path connected to the cell assembly 10 to receive an electric signal from the current sensor 30. In addition, the current measuring unit 100 may be configured to measure a charge/discharge current flowing through the charging/discharging path based on the electric signal received from the current sensor 30.

For example, as shown in FIG. 1, the current measuring unit 100 according to an embodiment of the present disclosure may be electrically connected to both ends of the current sensor 30. Here, the current sensor 30 may be electrically connected between a negative electrode terminal of the cell assembly 10 and a negative electrode terminal of a battery pack. In addition, the current measuring unit 100 may measure both-end voltage of the current sensor 30 and measure a charging current or a discharge current flowing through the charging/discharging path based on the both-end voltage of the current sensor 30. For example, the current measuring unit 100 may measure the current flowing through the charging/discharging path using the Ohm's law based on a resistance value of the current sensor 30 and the both-end voltage of the current sensor 30.

Preferably, the current measuring unit 100 may be electrically connected to the processor 400 to send and receive electric signals. In addition, the current measuring unit 100 may repeatedly measure a magnitude of the charge current or the discharge current of the cell assembly 10 at time intervals under the control of the processor 400 and output a signal indicating the magnitude of the measured current to the processor 400. For example, the current sensor 30 may be implemented using a hall sensor or a sensing resistor generally used in the art.

The voltage measuring unit 200 may be electrically connected to both ends of the cell assembly 10. For example, as shown in FIG. 1, the voltage measuring unit 200 may be electrically connected to both ends of the cell assembly 10 to send and receive electric signals.

In addition, the voltage measuring unit 200 may be configured to measure both-end voltage of the cell assembly 10. More specifically, the voltage measuring unit 200 may measure the both-end voltage of the cell assembly 10 based on electric signals received from both ends of the cell assembly 10. In addition, the voltage measuring unit 200 may be connected to a positive electrode terminal of the cell assembly 10 and a negative electrode terminal of the cell assembly 10, respectively, to measure the both-end voltage of the cell assembly 10.

Preferably, the voltage measuring unit 200 may be electrically connected to the processor 400 to send and receive electric signals. In addition, the voltage measuring unit 200 measures a potential difference between the positive electrode terminal of the cell assembly 10 and the negative electrode terminal of the cell assembly 10 at time intervals under the control of the processor 400 and output a signal indicating the magnitude of the measured voltage to the processor 400. For example, the voltage measuring unit 200 may be implemented using a voltage measuring circuit generally used in the art.

The processor 400 may receive the discharge current value and the both-end voltage value of the battery from the current measuring unit 100 and the voltage measuring unit 200. For example, as shown in FIG. 1, the processor 400 may be electrically connected to the current measuring unit 100 and the voltage measuring unit 200 to receive the discharge current value and the both-end voltage value of the battery from the current measuring unit 100 and the voltage measuring unit 200.

In addition, the processor 400 may measure a parking duration of the vehicle and determine a SOC estimation mode based on the parking duration. Preferably, the processor 400 according to an embodiment of the present disclosure may measure the parking duration based on an elapse time from a start ending point of the vehicle to a restarting point of the vehicle. In addition, the processor 400 according to an embodiment of the present disclosure may determine the SOC estimation mode based on the parking duration and a predetermined reference time value. For example, the predetermined reference time value may be 1 hour. In addition, the processor 400 may determine the SOC estimation mode based on a comparison result between the parking duration and the predetermined reference time value.

In addition, the processor 400 may estimate an initial SOC of the battery at starting of the vehicle based on the discharge current value during the parking duration according to the determined SOC estimation mode. For example, the processor 400 may estimate the initial SOC of the battery at the starting of the vehicle based on the discharge current value measured during the parking duration.

In addition, the processor 400 may correct the both-end voltage value of the battery based on the discharge current value when measuring the both-end voltage of the battery according to the determined SOC estimation mode and estimate the initial SOC of the battery at the starting of the vehicle based on the corrected both-end voltage value of the battery.

Preferably, if the vehicle is parked to terminate the starting of the vehicle, the processor 400 according to an embodiment of the present disclosure may wake up at every predetermined cycle during the parking duration and estimate a SOC of the battery based on the discharge current value measured by the current measuring unit 100 at the wake-up. For example, the processor 400 may wake up every 256 seconds during the parking duration to measure the discharge current value, and calculate a discharge amount for 256 seconds based on the measured discharge current value by using Equation 1 below.

$$C_{dis,sleep} = \frac{I_{dis,T-1} + I_{dis,T}}{2} \times t_T \qquad \text{[Equation 1]}$$

Here, $C_{dis,sleep}$ may be a discharge amount of one cycle during the parking duration, $I_{dis,T-1}$ may be a discharge current value of a previous cycle, $I_{dis,T}$ may be a discharge current value of a present cycle, and $t_T$ may be a time value of one cycle.

For example, if the discharge current value measured in the previous cycle before 256 seconds is 100 mA, the discharge current value measured in the present cycle is 60 mA and the time value of one cycle is 256 seconds, the processor 400 may calculate that the discharge amount for one cycle of 256 seconds is 0.005689 Ah as in Equation 2 below.

$$0.005689 Ah = \frac{100 \text{ mA} + 60 \text{ mA}}{2} \times 256 \text{ sec} \times \frac{1 \text{ h}}{3600 \text{ sec}} \times \frac{1 \text{ A}}{1000 \text{ mA}} \qquad \text{[Equation 2]}$$

More preferably, the processor 400 according to an embodiment of the present disclosure may estimate a SOC change amount during one cycle based on the discharge current value measured by the current measuring unit 100 at the wake-up and estimate the SOC of the battery based on the SOC change amount. For example, the processor 400 may estimate the SOC change amount based on the discharge amount of one cycle during the parking duration by using Equation 3 below.

$$\Delta SOC_T(\%) = \frac{C_{dis,sleep}}{C_B} \times 100 \qquad \text{[Equation 3]}$$

Here, $\Delta SOC_T$ may be a SOC change amount during one cycle, $C_{dis,sleep}$ may be a discharge amount of one cycle during the parking duration, and $C_B$ may be a capacity of the battery.

More preferably, the processor 400 according to an embodiment of the present disclosure may update the SOC of the battery at every wake-up cycle during the parking duration by correcting the SOC of the battery based on a value obtained by subtracting the SOC change amount estimated at the present cycle from the SOC of the battery estimated at the previous cycle. For example, the processor 400 may update the SOC of the battery at each wake-up cycle during the parking duration by using Equation 4 below.

$$SOC = SOC_{prev} - \Delta SOC_T \qquad \text{[Equation 4]}$$

Here, SOC may be an updated SOC of the battery, $SOC_{prev}$ may be a SOC of the battery in a previous cycle, and $\Delta SOC_T$ may be a SOC change amount during one cycle.

Through this configuration, the SOC estimating apparatus according to an embodiment of the present disclosure may continuously estimate the SOC during the parking duration repeatedly at every predetermined cycle (for example, every 256 seconds).

More preferably, the processor 400 according to an embodiment of the present disclosure may determine the SOC estimation mode based on a comparison result between the parking duration and the predetermined reference time value. More specifically, the SOC estimation mode may include an SOC correction mode and an OCV estimation mode.

Preferably, the processor 400 according to an embodiment of the present disclosure may determine the SOC estimation mode as the OCV estimation mode if the parking duration is equal to or greater than the predetermined reference time value. Also, preferably, the processor 400 according to an embodiment of the present disclosure may determine the SOC estimation mode as the SOC correction mode if the parking duration is smaller than the predetermined reference time value.

For example, if the parking duration is 1 hour or more, the processor 400 may determine the SOC estimation mode as the OCV estimation mode. In addition, if the parking duration is smaller than 1 hour, the processor 400 may determine the SOC estimation mode as the SOC correction mode.

The SOC correction mode may be a mode in which the initial SOC of the battery at the starting of the vehicle is estimated based on the discharge current value of the battery during the parking duration.

The OCV estimation mode may be a mode in which the both-end voltage value of the battery is corrected based on the discharge current value of the battery and the initial SOC of the battery at the starting of the vehicle is estimated based on the corrected both-end voltage value of the battery.

More preferably, if it is determined that the SOC estimation mode is the SOC correction mode, the processor 400 according to an embodiment of the present disclosure may estimate the initial SOC of the battery at the starting of the vehicle based on the SOC of the battery updated at every wake-up cycle. For example, if the parking duration measured at the starting of the vehicle is smaller than 1 hour, the processor 400 may determine the SOC estimation mode as the SOC correction mode. In addition, the processor 400 may estimate the initial SOC of the battery at the starting of the vehicle based on the SOC of the battery updated at every 256 seconds. For example, the processor 400 may estimate the SOC of the updated battery at a previous update cycle as the initial SOC of the battery at the starting of the vehicle.

More preferably, the processor 400 according to an embodiment of the present disclosure may estimate the SOC change amount after the previous wake-up cycle based on the discharge current value at the starting of the vehicle, correct the SOC of the battery updated at the previous wake-up cycle based on the SOC change amount, and estimate the initial SOC of the battery at the starting of the vehicle based on the corrected SOC of the battery.

More preferably, the SOC estimating apparatus according to an embodiment of the present disclosure may further include, as shown in FIG. 1, a temperature measuring unit 300.

The temperature measuring unit 300 may be provided adjacent to the cell assembly 10 to measure a temperature of the cell assembly 10. In addition, the temperature measuring unit 300 may be provided adjacent to the cell assembly 10 and electrically connected to the cell assembly 10 to send and receive electric signals. Alternatively, the temperature measuring unit 300 may be mounted to the cell assembly 10 and electrically connected to the cell assembly 10. Through this configuration, the temperature measuring unit 300 may measure the temperature of the cell assembly 10.

Preferably, the temperature measuring unit 300 may be mounted on an integrated circuit board of a battery management system (BMS). In particular, the temperature measuring unit 300 may be attached onto the integrated circuit board. For example, the temperature measuring unit 300 may be a NTC thermistor (Negative Temperature Coefficient thermistor) mounted in a soldered form on the integrated circuit board.

Preferably, the temperature measuring unit 300 may be electrically coupled to the processor 400 to send and receive electric signals. In addition, the temperature measuring unit 300 may repeatedly measure the temperature of the cell assembly 10 at time intervals and output a signal indicating the measured temperature to the processor 400. For example, the temperature measuring unit 300 may be implemented using a thermocouple generally used in the art.

More preferably, the processor 400 according to an embodiment of the present disclosure may receive the temperature measurement value of the battery from the temperature measuring unit 300, and if it is determined that the SOC estimation mode is the OCV estimation mode, the processor 400 may estimate the OCV of the battery based on the both-end voltage value, the discharge current value and the temperature measurement value measured at the starting of the vehicle and estimate the initial SOC of the battery at the starting of the vehicle using a SOC-OCV lookup table based on the estimated OCV.

More preferably, the processor 400 according to an embodiment of the present disclosure may calculate an internal resistance value of the battery based on the SOC and the temperature measurement value of the battery updated at the previous wake-up cycle, and estimate the OCV of the battery based on a difference between the product of the calculated internal resistance value and the discharge current value and the both-end voltage value. For example, the processor 400 may estimate the OCV of the battery using Equation 5 below, and estimate the initial SOC of the battery at the starting of the vehicle using the SOC-OCV lookup table based on the estimated OCV.

$$V_{OCV} = V_{init} - (I_{init} \times R_{(SOC,T)})$$ [Equation 5]

Here, $V_{OCV}$ may be an SOC of the battery at the starting of the vehicle, $V_{init}$ may be both-end voltage value of the battery measured at the starting of the vehicle, $I_{init}$ may be a discharge current value of the battery measured at the starting of the vehicle, and $R_{(SOC,T)}$ may be an internal resistance value of the battery.

Through this configuration, the SOC estimating apparatus according to an embodiment of the present disclosure may obtain an accurate OCV value of the battery by estimating the OCV of the battery in consideration of the fact that a current flows always at the vehicle-starting battery, without directly using the both-end voltage of the battery measured at the starting of the vehicle as the OCV of the battery.

Preferably, the SOC estimating apparatus according to an embodiment of the present disclosure may further include, as shown in FIG. 1, a memory device 500.

The memory device 500 may store information necessary for the operation of the SOC estimating apparatus according to an embodiment of the present disclosure in advance. In addition, the memory device 500 may be electrically connected to the processor 400 to send and receive electric signals. For example, the memory device 500 may store the SOC of the battery updated at every wake-up cycle. In addition, the memory device 500 may store an internal resistance value table of the battery having the SOC and the temperature measurement value as variables in advance. Also, the memory device 500 may store an SOC-OCV lookup table in advance.

Meanwhile, the processor 400 may be implemented to include a processor 400, an application-specific integrated circuit (ASIC), another chipset, a logic circuit, a register, a communication modem, and/or a data processing device, selectively.

Meanwhile, the memory device 500 is not particularly limited as long as it serves as a storage medium capable of recording and erasing data. For example, the memory device 500 may be RAM, ROM, a register, a hard disk, an optical recording medium, or a magnetic recording medium. The memory device 500 may also be electrically connected to the processor 400, for example, via a data bus or the like so as to be accessed by the processor 400. The memory device 500 may also store and/or update and/or erase and/or transmit data generated when a program including various control logics performed in the processor 400 and/or a control logic is executed.

The SOC estimating apparatus according to the present disclosure may be applied to the BMS. That is, the BMS according to the present disclosure may include the SOC estimating apparatus according to the present disclosure. In this configuration, at least some components of the SOC estimating apparatus according to the present disclosure may be implemented by supplementing or adding the functions of the components included in a conventional BMS. For example, the processor 400 and the memory device 500 of the SOC estimating apparatus according to the present disclosure may be implemented as components of the BMS.

In addition, the SOC estimating apparatus according to the present disclosure may be provided to a battery pack. That is, the battery pack according to the present disclosure may include the SOC estimating apparatus according to the present disclosure. Here, the battery pack may include at least one secondary battery, the SOC estimating apparatus, electronic equipment (such as a BMS, a relay, a fuse, etc.), a case, and the like.

A SOC estimating method according to an embodiment of the present disclosure is performed in the SOC estimating apparatus and may include a current measuring step, a voltage measuring step, and a SOC estimating step.

The current measuring step is a step of measuring a charge/discharge current of a battery and may be performed by the current measuring unit 100.

The voltage measuring step is a step of measuring both-end voltage of the battery and may be performed by the voltage measuring unit 200.

The SOC estimating step is a step of estimating an initial SOC of the battery based on the measurement results of the current measuring step and the voltage measuring step and may be performed by the processor 400.

Specifically, in the SOC estimating step, the processor 400 may receive the discharge current value and the both-end voltage value of the battery, measured in the current measuring step and the voltage measuring step.

In addition, the processor 400 may measure a parking duration of the vehicle and determine a SOC estimation mode based on the parking duration. For example, the processor 400 may determine the SOC estimation mode as a SOC correction mode or an OCV estimation mode.

The processor 400 may estimate the initial SOC of the battery at the starting of the vehicle based on the discharge current value during the parking duration according to the determined SOC estimation mode, or correct the both-end voltage of the battery based on the discharge current value when measuring the both-end voltage of the battery and estimate the initial SOC of the battery at the starting of the vehicle based on the corrected both-end voltage value of the battery.

The SOC estimating method will be described in detail with reference to the embodiment of FIG. 2.

Figure 2:
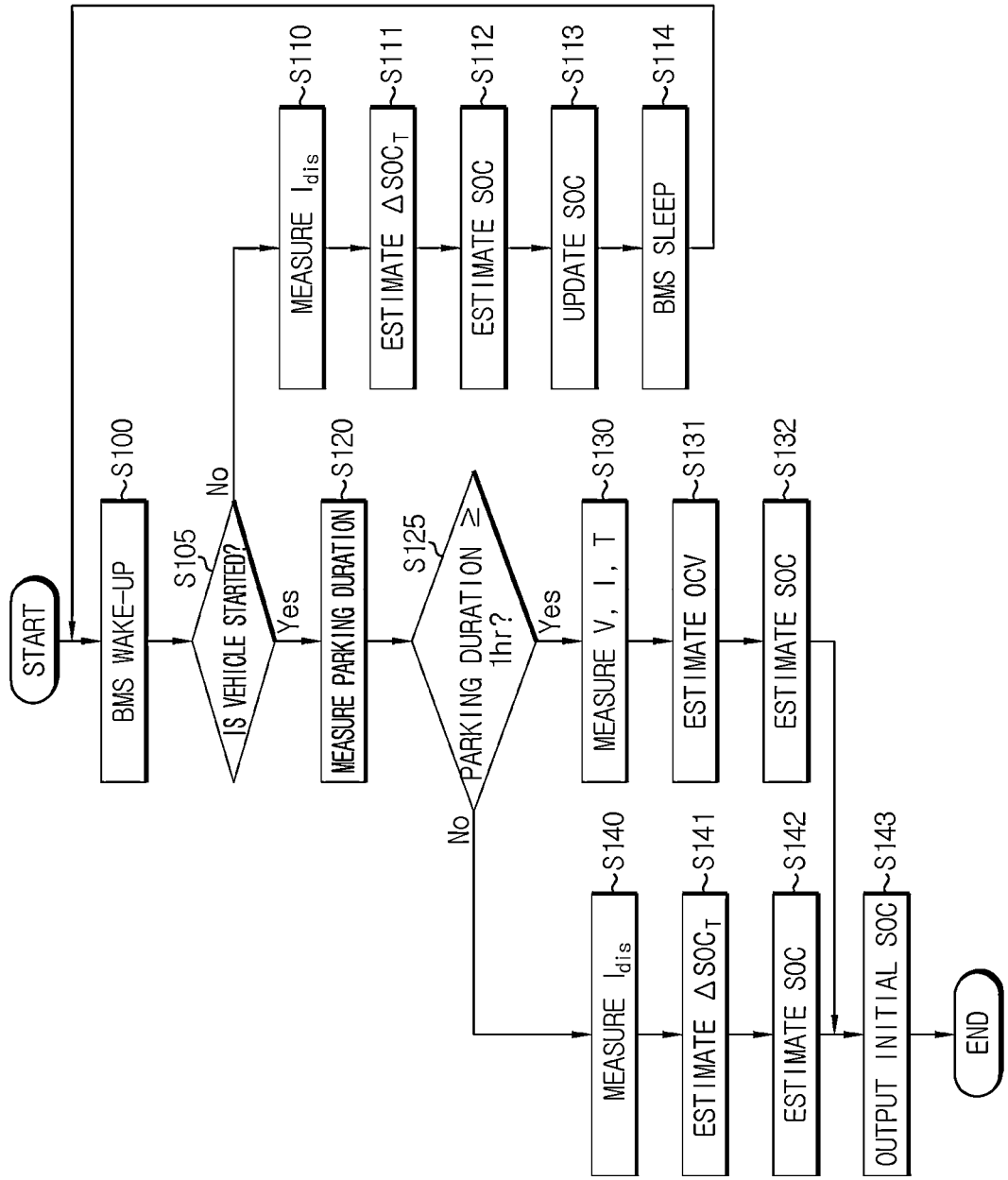
FIG. 2 is a flowchart schematically showing a SOC estimating method according to an embodiment of the present disclosure.

FIG. 2 is a flowchart schematically showing a SOC estimating method according to an embodiment of the present disclosure.

In the step S100, the processor 400 may wake up. For example, the processor 400 may wake up the BMS at every predetermined cycle. In this case, the operation mode of the BMS may be switched from a sleep mode to a wake-up mode at every predetermined cycle.

Subsequently, in the step S105, the processor 400 may determine whether the vehicle is started. That is, the processor 400 may determine whether the vehicle is in a driving mode or a parking mode based on whether the vehicle is started. If the vehicle is started in the step S105, the processor 400 may determine that the mode of the vehicle is the driving mode. In addition, the method may proceed to the step S120. Also, if the vehicle is not started in the step S105, the processor 400 may determine that the mode of the vehicle is the parking mode. In addition, the method may proceed to the step S110.

Subsequently, in the step S110, the processor 400 may receive the discharge current value measured by the current measuring unit 100. For example, the processor 400 may wake up at every predetermined cycle during the parking duration and receive the discharge current value measured by the current measuring unit 100 during the wake-up.

Subsequently, in the step S111, the processor 400 may estimate the SOC change amount based on the discharge amount of one cycle during the parking duration. For example, the processor 400 may estimate the SOC change amount using Equation 1 and Equation 3.

Subsequently, in the step S112, the processor 400 may estimate the SOC of the battery at each wake-up cycle during the parking duration. For example, the processor 400 may estimate the SOC of the battery using Equation 4.

Subsequently, in the step S113, the processor 400 may update the SOC of the battery at every wake-up cycle during the parking duration. For example, the processor 400 may update and store the SOC of the battery estimated at every wake-up cycle during the parking duration in the memory device.

Subsequently, in the step S114, the processor 400 may switch the BMS to the sleep mode. In this case, the operation mode of the BMS may be switched from the wake-up mode to the sleep mode. Subsequently, the method may return to the step S100.

In addition, in the step S120, the processor 400 may measure the parking duration. For example, the processor 400 may measure the parking duration based on an elapse time from a start ending point of the vehicle to a restarting point of the vehicle.

Subsequently, in the step S125, the processor 400 may determine whether the parking duration is equal to or greater than 1 hour, which is a predetermined time value. If the result of the step S125 is "YES", the method may proceed to the step S130. Otherwise, the method may proceed to the step S140.

Subsequently, in the step S130, the processor 400 may receive the both-end voltage value of the battery at the starting of the vehicle, the discharge current value of the battery at the starting of the vehicle and the temperature measurement value of the battery at the starting of the vehicle.

Subsequently, in the step S131, the processor 400 may estimate the OCV of the battery using Equation 5 based on the both-end voltage value, the discharge current value and the temperature measurement value.

Subsequently, in the step S132, the processor 400 may estimate the SOC using the SOC-OCV lookup table. Subsequently, the method may proceed to the step S143.

In addition, in the step S140, the processor 400 may receive the discharge current value measured by the current measuring unit 100. For example, the processor 400 may receive the discharge current value measured by the current measuring unit 100 at the starting of the vehicle.

Subsequently, in the step S141, the processor 400 may estimate the SOC change amount based on the discharge amount measured at the starting of the vehicle. For example, the processor 400 may estimate the SOC change amount using Equation 1 and Equation 3.

Subsequently, in the step S142, the processor 400 may estimate the SOC of the battery at the starting of the vehicle and update the SOC of the battery. For example, the processor 400 may estimate the SOC of the battery using Equation 4.

Subsequently, in the step S143, the processor 400 may output the estimated SOC of the battery as the initial SOC of the battery at the starting of the vehicle. For example, the processor 400 may output the initial SOC of the battery at the starting of the vehicle to an ECU (Electric Control Unit) of the vehicle, which is an external device.

Also, when the control logic is implemented in software, the processor may be implemented as a set of program modules. At this time, the program modules may be stored in a memory device and executed by a processor.

In addition, there is no particular limitation on the types of various control logics of the processor, as long as one or more control logics are combined and the combined control logic is written in a computer-readable code system so that the computer-readable access is possible. As one example, the recording medium includes at least one selected from the group consisting of a ROM, a RAM, a register, a CD-ROM, a magnetic tape, a hard disk, a floppy disk and an optical data recording device. In addition, the code system may be stored and executed in a distributed manner on computers connected through a network. Moreover, functional programs, code and segments for implementing the combined control logics may be easily inferred by programmers in the technical field to which the present disclosure belongs.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

REFERENCE SIGNS

10: cell assembly
50: starting motor
30: current sensor
70: vehicle electronic equipment
100: current measuring unit
200: voltage measuring unit
300: temperature measuring unit
400: processor
500: memory device

What is claimed is:

1. An apparatus in a battery management system (BMS) for estimating a state of charge (SOC) of a vehicle-starting battery, comprising:
    a current measuring unit configured to measure a discharge current of the battery;
    a voltage measuring unit configured to measure a terminal voltage of the battery, the terminal voltage of the battery being a voltage across two terminals of the battery; and
    a processor configured to:
        receive the discharge current value and the terminal voltage value of the battery respectively from the current measuring unit and the voltage measuring unit,
        measure a parking duration of the vehicle from a turnoff point at which the vehicle is turned off to a starting point at which the vehicle is restarted, and
        based on a length of the parking duration:
            estimate an initial SOC of the battery at the starting point of the vehicle based on the discharge current value during the parking duration, or
            estimate an open circuit voltage (OCV) of the battery based on the discharge current value and the terminal voltage value at the starting point of the vehicle, and estimate the initial SOC of the battery at the starting point of the vehicle based on the estimated OCV of the battery, wherein, during the parking duration with the vehicle turned off;
        the processor is configured to wake up the BMS from a sleep mode at a wake-up cycle in a predetermined interval;
        during the wake-up cycle, the current measuring unit is configured to measure the discharge current value;
        during the wake-up cycle, the processor is configured to estimate the SOC of the battery based on the discharge current value measured during the wake-up cycle and a discharge current value measured during a previous wake-up cycle; and
        the processor is configured then to return the BMS to the sleep mode after the wake-up cycle.

2. The apparatus for estimating the SOC according to claim 1,
    wherein the processor is further configured to measure the parking duration based on an elapse time from the turnoff point of the vehicle to the restarting point of the vehicle.

3. The apparatus for estimating the SOC according to claim 1,
    wherein the processor is further configured to determine whether the vehicle is turned on or off, the vehicle being in the parking duration if turned off.

4. The apparatus for estimating the SOC according to claim 3,
    wherein the processor is further configured to estimate a SOC change amount during one wake-up cycle based on the discharge current value measured by the current measuring unit at the wake-up cycle and to estimate the SOC of the battery based on the SOC change amount.

5. The apparatus for estimating the SOC according to claim 4,
    wherein the processor is further configured to update the SOC of the battery at every wake-up cycle during the parking duration by correcting the SOC of the battery based on a value obtained by subtracting a SOC change amount estimated at a present cycle from the SOC of the battery estimated at a previous cycle.

6. The apparatus for estimating the SOC according to claim 1,
    wherein the processor is configured to determine a SOC estimation mode to be an SOC correction mode or an OCV estimation mode based on the length of the parking duration and a predetermined reference time value,
    wherein, if the SOC estimation mode is the SOC correction mode, the processor is configured to estimate the initial SOC of the battery at the starting point of the vehicle based on the discharge current value of the battery during the parking duration, and
    wherein, if the SOC estimation mode is the OCV estimation mode, the processor is configured to estimate the OCV of the battery based on the discharge current value of the battery and to estimate the initial SOC of the battery at the starting point of the vehicle based on the estimated OCV of the battery.

7. The apparatus for estimating the SOC according to claim 6,
    wherein the processor is further configured to determine that the SOC estimation mode is the SOC correction mode if the length of the parking duration is smaller than the predetermined reference time value.

8. The apparatus for estimating the SOC according to claim 7,
    wherein, if the SOC estimation mode is the SOC correction mode, the processor is further configured to estimate the initial SOC of the battery at the starting point of the vehicle based on the SOC of the battery updated at every wake-up cycle during the parking duration.

9. The apparatus for estimating the SOC according to claim 8,
    wherein the processor is further configured to estimate a SOC change amount after a previous wake-up cycle based on the discharge current value at the starting point of the vehicle, correct the SOC of the battery updated at the previous wake-up cycle based on the SOC change amount, and estimate the initial SOC of the battery at the starting point of the vehicle based on the corrected SOC of the battery.

10. The apparatus for estimating the SOC according to claim 6, wherein the processor is further configured to determine that the SOC estimation mode is the OCV estimation mode if the length of the parking duration is equal to or greater than the predetermined reference time value.

11. The apparatus for estimating the SOC according to claim 10, further comprising:
a temperature measuring unit configured to measure a temperature of the battery.

12. The apparatus for estimating the SOC according to claim 11,
wherein the processor is further configured to:
receive the temperature measurement value of the battery from the temperature measuring unit, and
if the SOC estimation mode is the OCV estimation mode, estimate the OCV of the battery based on the terminal voltage value, the discharge current value, and the temperature measurement value measured at the starting point of the vehicle, and estimate the initial SOC of the battery at the starting point of the vehicle based on the estimated OCV using a SOC-OCV lookup table.

13. The apparatus for estimating the SOC according to claim 12,
wherein the processor is further configured to calculate an internal resistance value of the battery based on the SOC of the battery updated at a previous wake-up cycle and the temperature measurement value, and to estimate the OCV of the battery based on a difference between the terminal voltage value and the product of the calculated internal resistance value and the discharge current value.

14. A battery pack, comprising the apparatus for estimating the SOC according to claim 1.

15. The apparatus for estimating the SOC according to claim 1, wherein:
the current measuring unit is electrically connected to a current sensor disposed on a charging/discharging path of the battery and is configured to measure the discharge current of the battery based on a signal from the current sensor; and
during the wake-up cycle in the parking duration with the vehicle turned off, the current measuring unit is configured to measure the discharge current value based on the signal from the current sensor.

16. The apparatus for estimating the SOC according to claim 1, wherein:
during the wake-up cycle in the parking duration with the vehicle turned off, the processor is further configured to estimate the SOC of the battery based on a length of the wake-up cycle and on an average of the discharge current value measured during the wake-up cycle and the discharge current value measured during the previous wake-up cycle.

17. A method for estimating a state of charge (SOC) of a vehicle-starting battery for use in a battery management system (BMS), the method comprising:
measuring a charge/discharge current of the battery;
measuring a terminal voltage of the battery, the terminal voltage of the battery being a voltage across two terminals of the battery;
measuring a parking duration of the vehicle from a turnoff point at which the vehicle is turned off to a starting point at which the vehicle is restarted;
determining a SOC estimation mode to be an SOC correction mode or an open circuit voltage (OCV) estimation mode based on a length of the parking duration;
if the SOC estimation mode is determined to be the SOC correction mode, estimating an initial SOC of the battery at the starting point of the vehicle based on the discharge current value during the parking duration;
if the SOC estimation mode is determined to be the OCV estimation mode, estimating an OCV of the battery based on the discharge current value and the terminal voltage value of the battery at the starting point of the vehicle and estimating the initial SOC of the battery at the starting point of the vehicle based on the estimated OCV of the battery; and
during the parking duration with the vehicle turned off:
waking up the BMS from a sleep mode at a wake-up cycle in a predetermined interval of time;
measuring the discharge current value during the wake-up cycle;
estimating, during the wake-up cycle, the SOC of the battery based on the discharge current value measured during the wake-up cycle and a discharge current value measured during a previous wake-up cycle; and
then returning the BMS to the sleep mode after the wake-up cycle.

18. The method of claim 17, wherein the determining of the SOC estimation mode includes:
determining that the SOC estimation mode is the SOC correction mode if the length of the parking duration is smaller than a predetermined reference time value; and
determining that the SOC estimation mode is the OCV estimation mode if the length of the parking duration is greater than or equal to the predetermined reference time value.

19. The method of claim 17, wherein:
the measuring of the charge/discharge current includes measuring the charge/discharge current based on a signal from a current sensor disposed on a charging/discharging path of the battery; and
the measuring of the discharge current value during the wake-up cycle includes measuring the discharge current value based on the signal from the current sensor.

20. The method of claim 17, wherein the estimating of the SOC of the battery during the wake-up cycle includes estimating the SOC of the battery based on a length of the wake-up cycle and on an average of the discharge current value measured during the wake-up cycle and the discharge current value measured during the previous wake-up cycle.

* * * * *